(12) United States Patent
Asuri

(10) Patent No.: US 8,095,103 B2
(45) Date of Patent: Jan. 10, 2012

(54) UPCONVERTER AND DOWNCONVERTER WITH SWITCHED TRANSCONDUCTANCE AND LO MASKING

(75) Inventor: Bhushan Shanti Asuri, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 699 days.

(21) Appl. No.: 12/185,048

(22) Filed: Aug. 1, 2008

(65) Prior Publication Data

US 2010/0029239 A1 Feb. 4, 2010

(51) Int. Cl.
*H04B 15/00* (2006.01)
*H04B 1/26* (2006.01)

(52) U.S. Cl. .................. 455/313; 455/118; 455/323

(58) Field of Classification Search .............. 455/118, 455/130, 313, 323, 324, 307, 326, 333
See application file for complete search history.

(56) References Cited

U.S. PATENT DOCUMENTS

| | | | | |
|---|---|---|---|---|
| 7,139,544 B2 * | 11/2006 | Smith et al. | ............ | 455/307 |
| 7,224,722 B2 * | 5/2007 | Shi et al. | ............ | 375/219 |
| 7,319,851 B2 * | 1/2008 | Klumperink et al. | ......... | 455/323 |
| 7,415,260 B2 * | 8/2008 | Stockstad et al. | ............ | 455/312 |
| 7,457,606 B2 * | 11/2008 | Kim | ............ | 455/323 |
| 7,750,749 B2 * | 7/2010 | Jones | ............ | 332/105 |
| 2003/0072389 A1 * | 4/2003 | Li et al. | ............ | 375/308 |
| 2006/0146760 A1 | 7/2006 | Khandekar et al. | | |
| 2007/0092021 A1 | 4/2007 | Otaka et al. | | |

FOREIGN PATENT DOCUMENTS

| WO | WO2007053365 A1 | 5/2007 |
|---|---|---|
| WO | WO2008018034 | 2/2008 |

OTHER PUBLICATIONS

International Search Report & Written Opinion—PCT/US2009/052587, International Search Authority—European Patent Office—May 7, 2010.
NEC Group: "Performance of CAZAC pilot sequence for D-FDMA and L-FDMA with Frequency Hopping for EUTRA Uplink" TSG-RAN WG1 LTE ADHOC, [Online] No. R1-060060, Jan. 23, 2006-Jan. 25, 2006 pp. 1-7, XP002485861 Helsinki, Finland Retrieved from the Internet: URL:http://www.3gpp.org/ftp/tsg_ran/WG1_RL1/TSGR1_AH/LTE_AH_January-06/Docs/R 1-06006 0.zip> [retrieved on Jun. 19, 2008].
Nokia: "UL reference signal structure" [Online] No. R1-061910, Jun. 27, 2006, Jun. 30, 2006 pp. 1-7, XP002485860 Cannes, France Retrieved from the Internet: URL:http://www.3gpp.org/ftp/tsg_ran/WG1_RL1/TSGR1_AH/LTE_AH_June-06/Docs/R1-061910. zip> [retrieved on Jun. 19, 2008].
Fang et al., "An Image-Rejection Down-Converter for Low-IF Receivers", IEEE Transactions on Microwave Theory and Techniques, Feb. 2005, vol. 53, No. 2, pp. 478-487.
Jones et al., "Direct-Conversion WCDMA Transmitter with—163dBc/Hz Noise at 190 MHz Offset", 2007 IEEE International Solid-State Circuits Conference, Feb. 13, 2007, pp. 336-338.
Klumperink et al. "A CMOS Switched Transconductor Mixer", IEEE Journal of Solid State-Circuits, Aug. 2004, vol. 39, No. 4, pp. 1231-1240.

\* cited by examiner

*Primary Examiner* — Sonny Trinh
(74) *Attorney, Agent, or Firm* — Jonathan Velasco

(57) ABSTRACT

An upconverter and a downconverter having good performance are described. In one design, the upconverter includes first, second, and third sets of transistors. The first set of transistors receives baseband signals and provides an upconverted signal. The second set of transistors switches the transconductance of the transistors in the first set based on transmit (TX) local oscillator (LO) signals. The third set of transistors enables and disables the transistors in the second set based on a TX VCO signal. In one design, the downconverter includes first, second, and third sets of transistors. The first set of transistors receives a modulated signal and provides baseband signals. The second set of transistors switches the transconductance of the transistors in the first set based on receive (RX) LO signals. The third set of transistors enables and disables the transistors in the second set based on an RX VCO signal.

37 Claims, 8 Drawing Sheets

US 8,095,103 B2

UPCONVERTER AND DOWNCONVERTER WITH SWITCHED TRANSCONDUCTANCE AND LO MASKING

BACKGROUND

I. Field

The present disclosure relates generally to electronics, and more specifically to an upconverter and a downconverter for a wireless communication device.

II. Background

A wireless communication device such as a cellular phone typically includes a transmitter and a receiver to support bi-directional communication. The transmitter may upconvert inphase (I) and quadrature (Q) output baseband signals with I and Q transmit (TX) local oscillator (LO) signals to obtain a radio frequency (RF) output signal that is more suitable for transmission via a wireless channel. The receiver may receive an RF input signal via the wireless channel and may downconvert the RF input signal with I and Q receive (RX) LO signals to obtain I and Q input baseband signals. It is desirable to perform upconversion and downconversion in a manner to obtain good performance.

SUMMARY

An upconverter and a downconverter having good performance are described herein. In an aspect, the upconverter and downconverter may each implement switched transconductance and/or LO masking. The transconductance $g_m$ of a transistor is a function of output current versus input voltage and is related to the gain of the transistor. Switched transconductance refers to switching the transconductance of baseband or RF transistors between low and high with LO transistors coupled to the sources of the baseband or RF transistors. For an upconverter, the baseband transistors receive I and Q baseband signals and provide an upconverted signal. For a downconverter, the RF transistors receive an RF input signal and provide downconverted I and Q baseband signals. The LO transistors switch the transconductance of the baseband or RF transistors and perform mixing function. LO masking refers to re-clocking LO signals with a VCO signal from a voltage-controlled oscillator (VCO), so that the transconductance of the baseband or RF transistors is switched during transitions of the VCO signal. Switched transconductance and LO masking may provide various advantages, as described below.

In one design, the upconverter includes first, second, and third sets of transistors. The first set of transistors receives baseband signals and provides an upconverted signal. The second set of transistors couples to the sources of the transistors in the first set and switches the transconductance of the transistors in the first set based on TX LO signals. The third set of transistors couples to the second set of transistors and enables and disables the transistors in the second set based on a TX VCO signal. The transistors in the second and third sets may operate as switches.

In one design, the downconverter includes first, second, and third sets of transistors. The first set of transistors receives a modulated signal and provides baseband signals. The second set of transistors couples to the sources of the transistors in the first set and switches the transconductance of the transistors in the first set based on RX LO signals. The third set of transistors couples to the second set of transistors and enables and disables the transistors in the second set based on an RX VCO signal. The transistors in the second and third sets may operate as switches.

Various aspects and features of the disclosure are described in further detail below.

DETAILED DESCRIPTION

The upconverter and downconverter described herein may be used for various communication devices and systems. For example, the upconverter and downconverter may be used for wireless communication devices, cellular phones, personal digital assistants (PDAs), handheld devices, wireless modems, laptop computers, cordless phones, Bluetooth devices, etc. For clarity, the use of the upconverter and downconverter for a wireless communication device, which may be a cellular phone or some other device, is described below.

Figure 1:
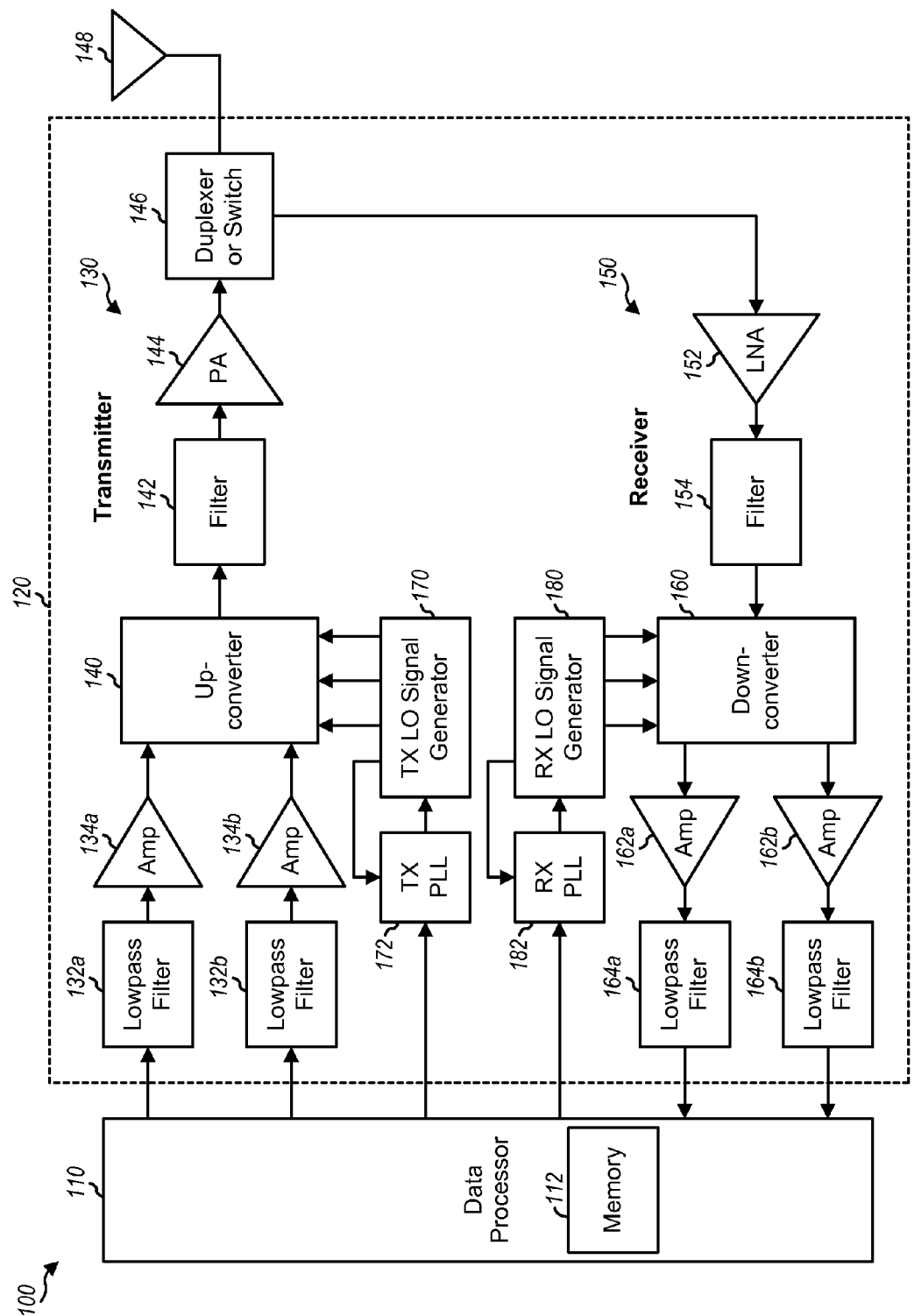
FIG. 1 shows a block diagram of a wireless communication device.

FIG. 1 shows a block diagram of a wireless communication device 100. In this design, wireless device 100 includes a data processor 110 having a memory 112 to store data and program codes and a transceiver 120. Transceiver 120 includes a transmitter 130 and a receiver 150 that support bi-directional communication. In general, wireless device 100 may include any number of transmitters and any number of receivers for any number of communication systems and frequency bands.

A transmitter or a receiver may be implemented with a super-heterodyne architecture or a direct-conversion architecture. In the super-heterodyne architecture, a signal is frequency converted between RF and baseband in multiple stages, e.g., from RF to an intermediate frequency (IF) in one stage, and then from IF to baseband in another stage for a receiver. In the direct-conversion architecture, which is also referred to as a zero-IF architecture, a signal is frequency converted between RF and baseband in one stage. The super-heterodyne and direct-conversion architectures may use different circuit blocks and/or have different requirements. In the design shown in FIG. 1, transmitter 130 and receiver 150 are implemented with the direct-conversion architecture.

In the transmit path, data processor 110 processes data to be transmitted and provides I and Q analog output signals to transmitter 130. Within transmitter 130, lowpass filters 132a and 132b filter the I and Q analog output signals, respectively, to remove images caused by the prior digital-to-analog conversion. Amplifiers (Amp) 134a and 134b amplify the signals from lowpass filters 132a and 132b, respectively, and provide I and Q baseband signals. An upconverter 140 receives the I and Q baseband signals, I and Q TX LO signals from an LO signal generator 170, and possibly a TX VCO signal from a VCO within LO signal generator 170. Upconverter 140 upconverts the I and Q baseband signals with the I and Q TX LO signals and provides an upconverted signal. A filter 142 filters the upconverted signal to remove images caused by the frequency upconversion and to remove noise in a receive frequency band. Filter 142 may be a surface acoustic wave (SAW) filter or some other type of filter. A power amplifier (PA) 144 amplifies the signal from filter 142 to obtain the desired output power level and provides a transmit RF signal. The transmit RF signal is routed through a duplexer or switch 146 and transmitted via an antenna 148.

In the receive path, antenna 148 receives signals transmitted by base stations and provides a received RF signal, which is routed through duplexer or switch 146 and provided to a low noise amplifier (LNA) 152. The received RF signal is amplified by LNA 152 and filtered by a filter 154 to obtain an RF input signal. A downconverter 160 receives the RF input signal, I and Q RX LO signals from an LO signal generator 180, and possibly an RX VCO signal from a VCO within LO signal generator 180. Downconverter 160 downconverts the RF input signal with the I and Q RX LO signals and provides I and Q baseband signals. The I and Q baseband signals are amplified by amplifiers 162a and 162b and further filtered by lowpass filters 164a and 164b to obtain I and Q analog input signals, which are provided to data processor 110.

LO signal generator 170 generates the I and Q TX LO signals used for frequency upconversion. LO signal generator 180 generates the I and Q RX LO signals used for frequency downconversion. Each LO signal is a periodic signal with a particular fundamental frequency. The TX LO signals and the RX LO signals may have (i) the same frequency if the system utilizes time division duplexing (TDD) or (ii) different frequencies if the system utilizes frequency division duplexing (FDD). A phase locked loop (PLL) 172 receives timing information from data processor 110 and the TX VCO signal from LO signal generator 170. PLL 172 generates a control signal used to adjust the frequency and/or phase of the TX LO signals from LO signal generator 170. Similarly, a PLL 182 receives timing information from data processor 110 and the RX VCO signal from LO signal generator 180. PLL 182 generates a control signal used to adjust the frequency and/or phase of the RX LO signals from LO signal generator 180.

FIG. 1 shows an example transceiver design. In general, the conditioning of the signals in a transmitter and a receiver may be performed by one or more stages of amplifier, filter, upconverter, downconverter, etc. These circuit blocks may be arranged differently from the configuration shown in FIG. 1. Furthermore, other circuit blocks not shown in FIG. 1 may also be used to condition the signals in the transmitter and receiver. Some circuit blocks in FIG. 1 may also be omitted. For example, filter 142 may be omitted, and the output of upconverter 140 may be coupled directly to power amplifier 144. As another example, filter 154 may be omitted, and the output of LNA 152 may be coupled directly to downconverter 160. All or a portion of transceiver 120 may be implemented on one or more analog integrated circuits (ICs), RF ICs (RFICs), mixed-signal ICs, etc.

Figure 2:
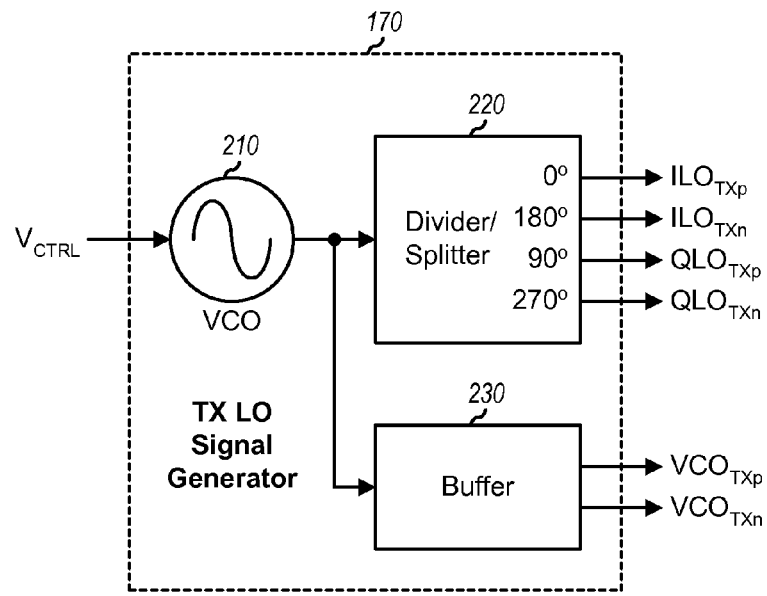
FIG. 2 shows a block diagram of an LO signal generator.

FIG. 2 shows a block diagram of a design of LO signal generator 170 in FIG. 1. Within LO signal generator 170, a VCO 210 receives a control signal $V_{CTRL}$ from PLL 172 and generates the TX VCO signal at a desired output frequency, as determined by the control signal. A divider/splitter 220 receives and divides the TX VCO signal in frequency (e.g., by a factor of two) and generates (i) a differential I TX LO signal composed of a non-inverted I TX LO signal, $ILO_{TXp}$, and an inverted I TX LO signal, $ILO_{TXn}$, and (ii) a differential Q TX LO signal composed of a non-inverted Q TX LO signal, $QLO_{TXp}$, and an inverted Q TX LO signal, $QLO_{TXn}$. The $ILO_{TXp}$, $QLO_{TXp}$, $ILO_{TXn}$ and $QLO_{TXn}$ signals are 90° out of phase of each other, as shown in FIG. 2. In general, divider/splitter 220 may include any number of frequency dividers and any number of signal splitters. A buffer 230 also receives the TX VCO signal and generates a differential TX VCO signal composed of a non-inverted TX VCO signal, $VCO_{TXp}$, and an inverted TX VCO signal, $VCO_{TXn}$. The $VCO_{TXp}$ and $VCO_{TXn}$ signals are 180° out of phase of each other. In the description herein, subscript "p" denotes a non-inverted/positive signal, and subscript "n" denotes an inverted/negative signal. A differential signal is composed of a non-inverted signal and an inverted signal (e.g., $ILO_{TXp}$ and $ILO_{TXn}$ signals), and a complementary signal is composed of the inverted signal and the non-inverted signal (e.g., $ILO_{TXn}$ and $ILO_{TXp}$ signals).

Figure 3:
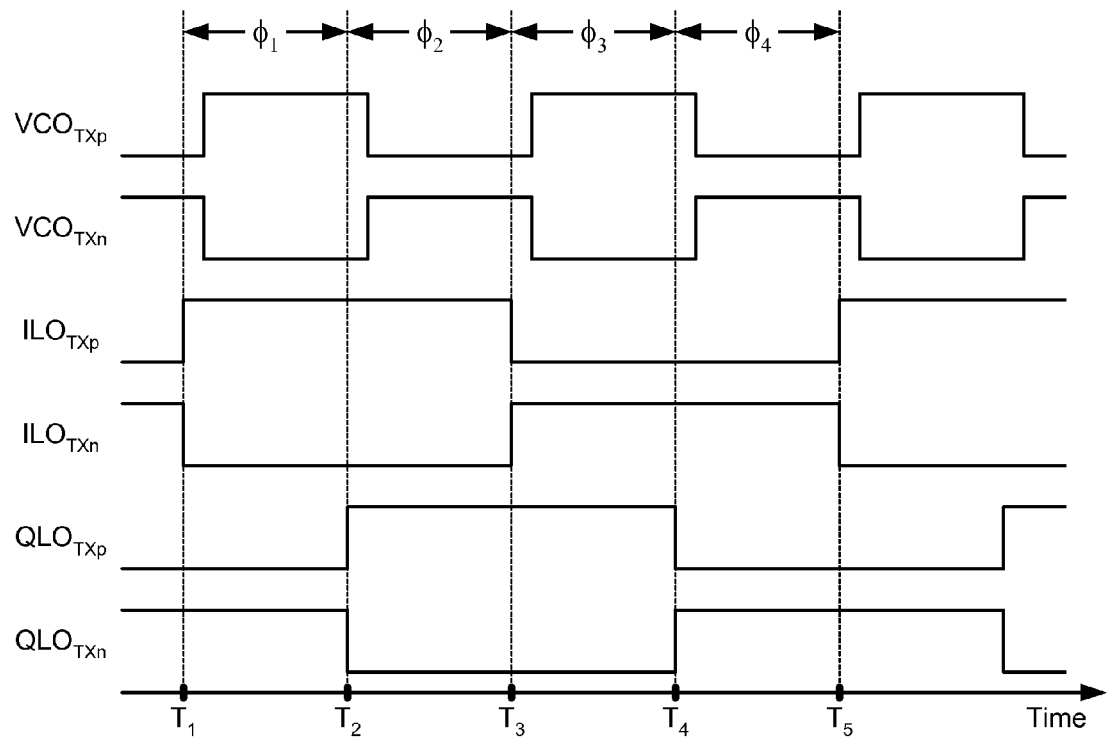
FIG. 3 shows a timing diagram of I and Q LO signals and a VCO signal.

FIG. 3 shows an example timing diagram of the I and Q TX LO signals and the TX VCO signal. The TX VCO signal may be divided by a factor of two in frequency to generate the TX LO signals. The I and Q TX LO signals would then have a frequency that is one half the frequency of the TX VCO signal. The $VCO_{TXp}$ and $VCO_{TXn}$ signals are shown at the top of FIG. 3. The $QLO_{TXp}$ and $QLO_{TXn}$ signals are delayed by 90° from the $ILO_{TXp}$ and $ILO_{TXn}$ signals. Each cycle of the TX LO signals may be partitioned into four phases. A first phase $\phi_1$ covers the time period from the rising edge of the $ILO_{TXp}$ signal at time $T_1$ to the rising edge of the $QLO_{TXp}$ signal at time $T_2$. A second phase $\phi_2$ covers the time period from the rising edge of the $QLO_{TXp}$ signal to the rising edge of the $ILO_{TXn}$ signal at time $T_3$. A third phase $\phi_3$ covers the time period from the rising edge of the $ILO_{TXn}$ signal to the rising edge of the $QLO_{TXn}$ signal at time $T_4$. A fourth phase $\phi_4$ covers the time period from the rising edge of the $QLO_{TXn}$ signal to the rising edge of the $ILO_{TXp}$ signal at time $T_5$.

Upconverter 140 and downconverter 160 in FIG. 1 may be implemented with various designs, which may have different performance in terms of noise and linearity. Upconverter 140 and downconverter 160 may also be implemented with single-ended designs or differential designs. Several differential designs of upconverter 140 and downconverter 160 are described below.

Figure 4:
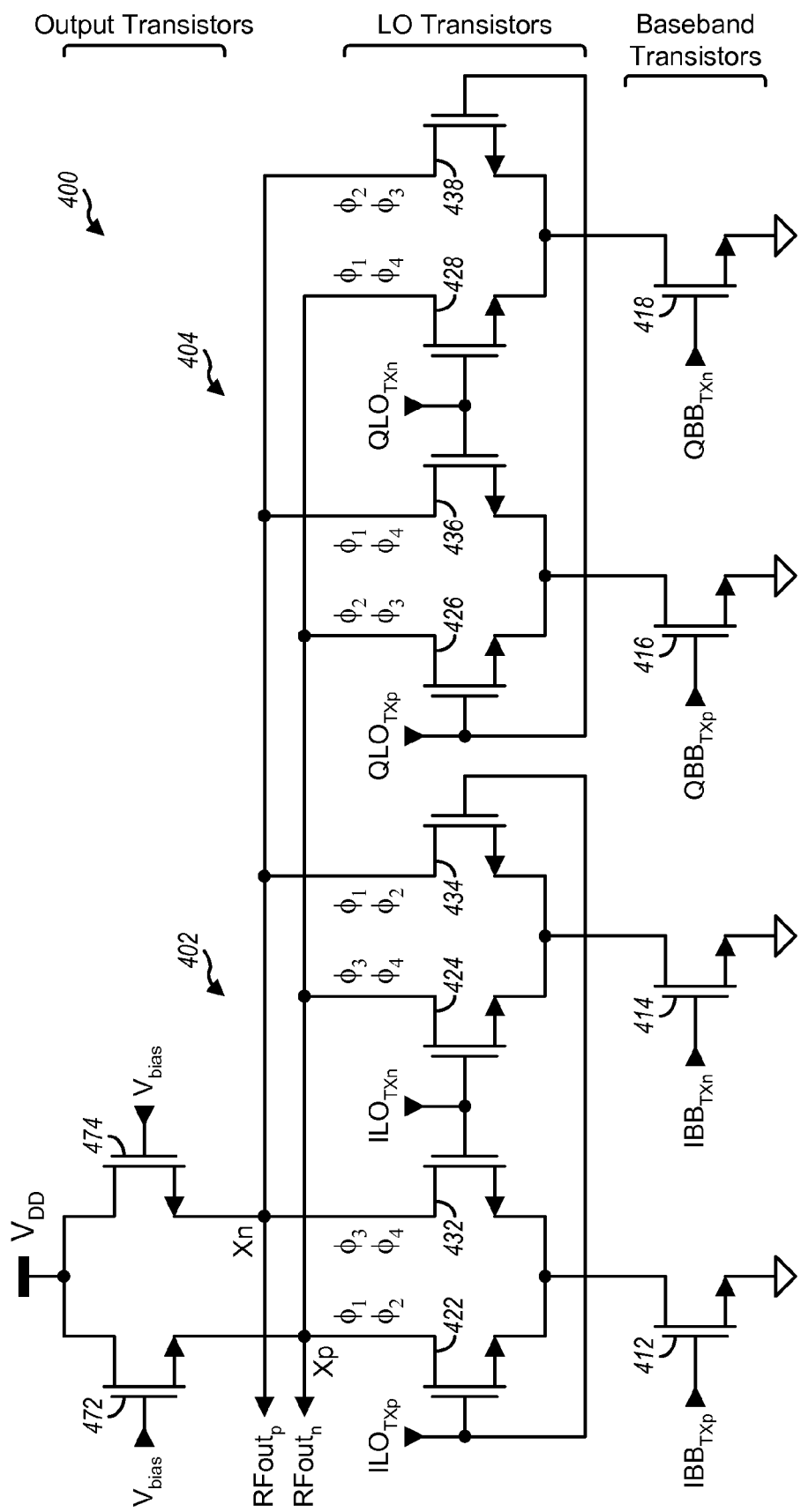
FIG. 4 shows an upconverter with Gilbert cell mixers.

FIG. 4 shows a schematic diagram of an upconverter 400 implemented with Gilbert cell mixers. Upconverter 400 includes an I mixer 402, a Q mixer 404, and a summer implemented with current summing nodes Xp and Xn. I mixer 402 upconverts a differential I baseband signal (composed of $IBB_{TXp}$ and $IBB_{TXn}$ signals) with the differential I LO signal (composed of $ILO_{TXp}$ and $ILO_{TXn}$ signals) and provides a differential I upconverted signal at nodes Xp and Xn. Q mixer 404 upconverts a differential Q baseband signal (composed of $QBB_{TXp}$ and $QBB_{TXn}$ signals) with the differential Q LO signal (composed of $QLO_{TXp}$ and $QLO_{TXn}$ signals) and provides a differential Q upconverted signal at nodes Xp and Xn. The differential I and Q upconverted signals are summed at nodes Xp and Xn to obtain a differential upconverted signal composed of $RFout_p$ and $RFout_n$ signals.

Within I mixer 402, N-channel metal oxide semiconductor (NMOS) transistors 412 and 414 have their sources coupled to circuit ground and their gates receiving the $IBB_{TXp}$ and $IBB_{TXn}$ signals, respectively. The terms "transistor" and "device" are often used interchangeably, e.g., MOS transistors are often referred to as MOS devices. NMOS transistors 422 and 432 have their sources coupled to the drain of NMOS transistor 412, their gates receiving the $ILO_{TXp}$ and $ILO_{TXn}$ signals, respectively, and their drains coupled to nodes Xp and Xn, respectively. NMOS transistors 424 and 434 have their sources coupled to the drain of NMOS transistor 414, their gates receiving the $ILO_{TXn}$ and $ILO_{TXp}$ signals, respectively, and their drains coupled to nodes Xp and Xn, respectively. NMOS transistors 472 and 474 have their sources coupled to nodes Xp and Xn, respectively, their gates receiving a bias voltage, $V_{bias}$, and their drains coupled to a power supply, $V_{DD}$.

Within Q mixer 404, NMOS transistors 416 and 418 have their sources coupled to circuit ground and their gates receiving the $QBB_{TXp}$ and $QBB_{TXn}$ signals, respectively. NMOS transistors 426 and 436 have their sources coupled to the drain of NMOS transistor 416, their gates receiving the $QLO_{TXp}$ and $QLO_{TXn}$ signals, respectively, and their drains coupled to nodes Xp and Xn, respectively. NMOS transistors 428 and 438 have their sources coupled to the drain of NMOS transistor 418, their gates receiving the $QLO_{TXn}$ and $QLO_{TXp}$ signals, respectively, and their drains coupled to nodes Xp and Xn, respectively.

NMOS transistors 412 to 418 are baseband transistors that provide amplification for the I and Q baseband signals. NMOS transistors 422 to 438 are LO transistors that are operated in cascode and perform current steering to achieve the mixing function for upconversion. NMOS transistors 472 and 474 are output transistors that provide signal drive for the upconverted signal.

Upconverter 400 operates as follows. The phases in which each LO transistor is enabled is shown in FIG. 4. During the first phase $\phi_1$, NMOS transistors 422, 434, 436 and 428 are enabled, current is directed through either NMOS transistor 422 or 434 depending on the IBB signal, and current is directed through either NMOS transistor 436 or 428 depending on the QBB signal. During the second phase $\phi_2$, NMOS transistors 422, 434, 426 and 438 are enabled, current is directed through either NMOS transistor 422 or 434 depending on the IBB signal, and current is directed through either NMOS transistor 426 or 438 depending on the QBB signal. During the third phase $\phi_3$, NMOS transistors 432, 424, 426 and 438 are enabled, current is directed through either NMOS transistor 432 or 424 depending on the IBB signal, and current is directed through either NMOS transistor 426 or 438 depending on the QBB signal. During the fourth phase $\phi_4$, NMOS transistors 432, 424, 436 and 428 are enabled, current is directed through either NMOS transistor 432 or 424 depending on the IBB signal, and current is directed through either NMOS transistor 436 or 428 depending on the QBB signal.

Upconverter 400 with Gilbert cell mixers has several disadvantages. First, the Gilbert cell mixers may generate a relatively high level of noise in the receive frequency band, which may then require the use of a SAW filter for filter 142 in FIG. 1 to attenuate the noise. Second, voltage headroom for the baseband transistors in FIG. 4 may be constrained, especially with a low supply voltage, since some of the voltage headroom is used for the LO transistors. Third, coupling capacitors may be needed to AC couple the I and Q TX LO signals to the LO transistors. Furthermore, the bias voltage for the LO transistors may need to be set carefully in order to obtain good performance. Fourth, high current may be consumed by each mixer. Fifth, a modulation factor m may be limited by the linearity requirements in the overall transmit path. The limited modulation factor may result in lower output power and lower signal-to-noise ratio (SNR) for the upconverted signal.

Figure 5:
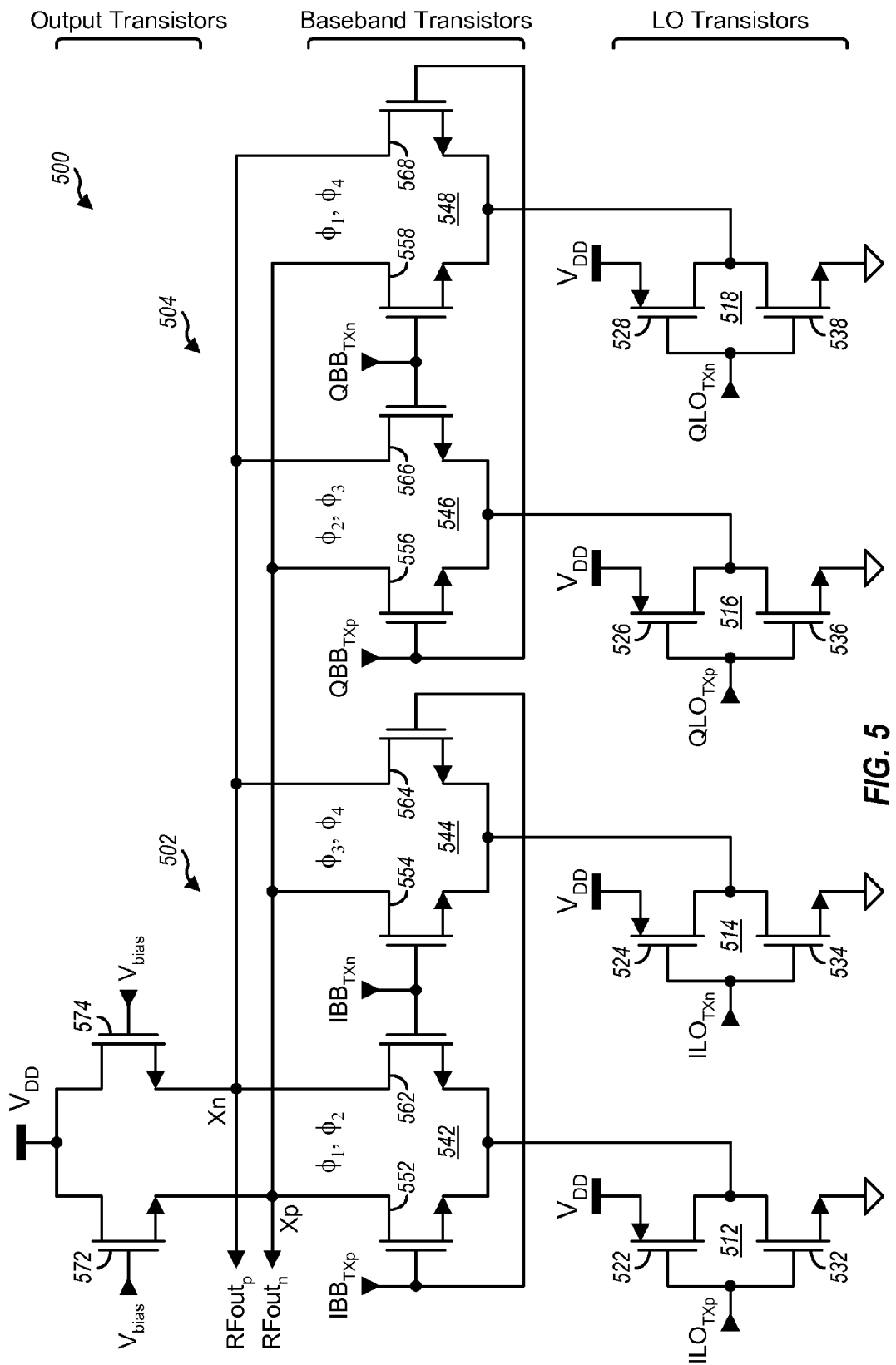
FIG. 5 shows an upconverter with switched transconductance.

FIG. 5 shows a schematic diagram of a design of an upconverter 500 with switched transconductance. Upconverter 500 may be used for upconverter 140 in FIG. 1 and includes an I mixer 502, a Q mixer 504, and a summer implemented with current summing nodes Xp and Xn.

Within I mixer 502, an inverter 512 is implemented with a P-channel metal oxide semiconductor (PMOS) transistor 522 and an NMOS transistor 532 and receives the $ILO_{TXp}$ signal. MOS transistors 522 and 532 have their gates coupled together and forming the inverter input, their drains coupled together and forming the inverter output, and their sources coupled to the upper and lower power supplies, respectively. The lower power supply is circuit ground in FIG. 5 but may be some other voltage or signal. NMOS transistors 552 and 562 form a differential pair 542 and have their sources coupled to the output of inverter 512, their gates receiving the $IBB_{TXp}$ and $IBB_{TXn}$ signals, respectively, and their drains coupled to nodes Xp and Xn, respectively. An inverter 514 is implemented with a PMOS transistor 524 and an NMOS transistor 534 and receives the $ILO_{TXn}$ signal. NMOS transistors 554 and 564 form a differential pair 544 and have their sources coupled to the output of inverter 514, their gates receiving the $IBB_{TXn}$ and $IBB_{TXp}$ signals, respectively, and their drains coupled to nodes Xp and Xn, respectively. NMOS transistors 572 and 574 have their sources coupled to nodes Xp and Xn, respectively, their gates receiving the bias voltage, $V_{bias}$, and their drains coupled to the power supply.

Within Q mixer 504, an inverter 516 is implemented with a PMOS transistor 526 and an NMOS transistor 536 and receives the $QLO_{TXp}$ signal. NMOS transistors 556 and 566 form a differential pair 546 and have their sources coupled to the output of inverter 516, their gates receiving the $QBB_{TXp}$ and $QBB_{TXn}$ signals, respectively, and their drains coupled to nodes Xp and Xn, respectively. An inverter 518 is implemented with a PMOS transistor 528 and an NMOS transistor 538 and receives the $QLO_{TXn}$ signal. NMOS transistors 558 and 568 form a differential pair 548 and have their sources coupled to the output of inverter 518, their gates receiving the $QBB_{TXn}$ and $QBB_{TXp}$ signals, respectively, and their drains coupled to nodes Xp and Xn, respectively.

In upconverter 500, differential pairs 542 and 544 drive the upconverter output with opposite polarity of the I baseband signal. The I TX LO signal selects differential pair 542 for half of the LO cycle (e.g., phases $\phi_1$ and $\phi_2$) and selects differential pair 544 for the other half of the LO cycle (e.g., phases $\phi_3$ and $\phi_4$). Similarly, differential pairs 546 and 548 drive the upconverter output with opposite polarity of the Q baseband signal. The Q TX LO signal selects differential pair 546 for half of the LO cycle (e.g., phases $\phi_2$ and $\phi_3$) and selects differential pair 548 for the other half of the LO cycle (e.g., phases $\phi_1$ and $\phi_4$).

MOS transistors 522 to 538 are LO transistors that perform transconductance switching to achieve the mixing function for upconversion. NMOS transistors 552 to 568 are baseband transistors that provide amplification for the I and Q baseband signals. NMOS transistors 572 and 574 are output transistors that provide signal drive for the upconverted signal.

FIG. 5 shows a specific design with the baseband transistors, LO transistors, and VCO transistors coupled in a specific manner and with specific signals applied to these transistors. The desired upconverted signal may also be obtained with other arrangements of the baseband transistors, LO transistors, and VCO transistors and/or by applying the signals to these transistors in other manners.

Upconverter 500 operates as follows. Each of the four inverters 512 to 518 may be enabled or disabled based on its LO signal. Each inverter is coupled to a respective differential pair and performs transconductance switching of that differential pair. The transconductance of the differential pair is low when the inverter output is high and is high when the inverter output is low. Each differential pair with high transconductance amplifies its baseband signal and drives the upconverter output. The mixing function may be achieved by switching the transconductance of different differential pairs in different phases of each LO cycle.

The timing diagram shown in FIG. 3 may be used for upconverter 500 in FIG. 5. During the first phase $\phi_1$, the outputs of inverters 512 and 518 are low, and NMOS transistors 552, 562, 558 and 568 have high transconductance and drive the upconverter output based on the I baseband signal and the complementary Q baseband signal. During the second phase $\phi_2$, the outputs of inverters 512 and 516 are low, and NMOS transistors 552, 562, 556 and 566 have high transconductance and drive the upconverter output based on the I and Q baseband signals. During the third phase $\phi_3$, the outputs of inverters 514 and 516 are low, and NMOS transistors 554, 564, 556 and 566 have high transconductance and drive the upconverter output based on the complementary I baseband signal and the Q baseband signal. During the fourth phase $\phi_4$, the outputs of inverters 514 and 518 are low, and NMOS transistors 554, 564, 558 and 568 have high transconductance and drive the upconverter output based on the complementary I and Q baseband signals.

Upconverter 500 with switched transconductance has several advantages. First, the LO transistors are located at the sources of the baseband transistors (instead of the drains of the baseband transistors as shown in FIG. 4). This allows the LO transistors to be operated as switches that may be driven rail to rail in similar manner as logic gates. Furthermore, operating the LO transistors as switches (instead of as cascode transistors as shown in FIG. 4) results in no voltage headroom being needed for the LO transistors. This may provide more voltage headroom for the baseband transistors, which may reduce noise. The LO transistors in upconverter 500 also consume less power than the LO transistors in upconverter 400. In particular, the LO transistors in upconverter 500 consume $I_{DC} \cdot r_{on}$, where $I_{DC}$ is the current when turned on and $r_{on}$ is the on resistance, which may be very small for switches. In addition, it can be shown that the noise from the LO transistors may be suppressed, which may improve the upconverted signal quality. The common mode LO leakage through the gate-to-drain capacitance $C_{gd}$ may also be suppressed, which may be beneficial for single-ended mixer designs.

Figure 6A:
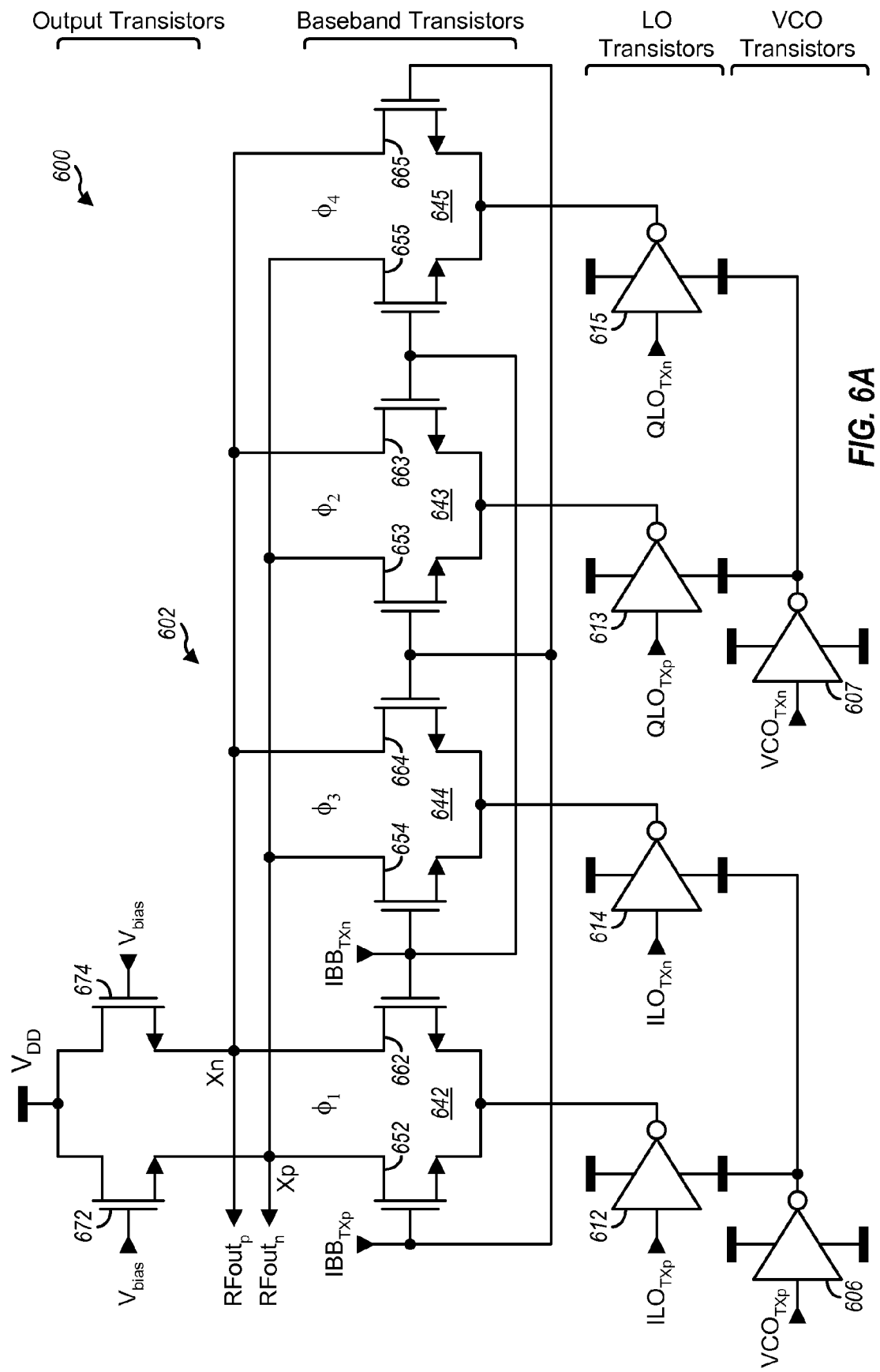
FIGS. 6A and 6B show an upconverter with switched transconductance and LO masking.
Figure 6B:
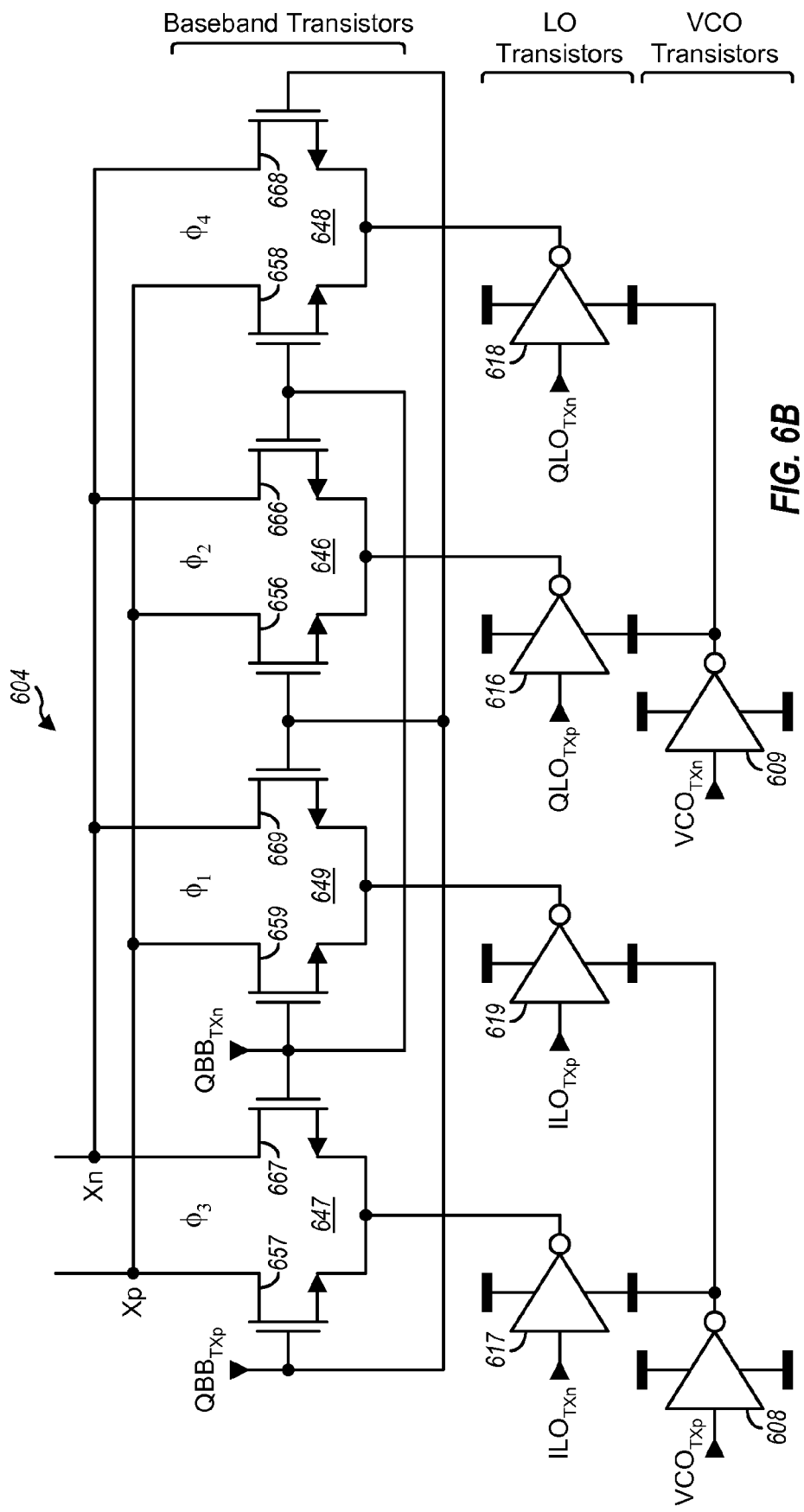

FIGS. 6A and 6B show a schematic diagram of a design of an upconverter 600 with switched transconductance and LO masking. Upconverter 600 may also be used for upconverter 140 in FIG. 1 and includes an I mixer 602 shown in FIG. 6A, a Q mixer 604 shown in FIG. 6B, and a summer implemented with current summing nodes Xp and Xn shown in FIG. 6A.

As shown in FIG. 6A, I mixer 602 includes inverters 612 and 614 and NMOS transistors 652, 654, 662 and 664 that are coupled in the same manner as inverters 512 and 514 and NMOS transistors 552, 554, 562 and 564, respectively, for I mixer 502 in FIG. 5. I mixer 602 further includes inverters 613 and 615 and NMOS transistors 653, 655, 663 and 665 that are coupled in similar manner as inverters 612 and 614 and NMOS transistors 652, 654, 662 and 664, respectively. The gates of NMOS transistors 652, 664, 653 and 665 receive the $IBB_{TXp}$ signal, and the gates of NMOS transistors 662, 654, 663 and 655 receive the $IBB_{TXn}$ signal. The drains of NMOS transistors 652, 654, 653 and 655 couple to node Xp, and the drains of NMOS transistors 662, 664, 663 and 665 couple to node Xn.

I mixer 602 further includes inverters 606 and 607 that receive the differential TX VCO signal and enable and disable inverters 612 to 618. Inverter 606 has its input receiving the $VCO_{TXp}$ signal and its output coupled to the lower power supply of inverters 612 and 614, which may correspond to the sources of NMOS transistors 532 and 534 in FIG. 5. Inverter 607 has its input receiving the $VCO_{TXn}$ signal and its output coupled to the lower power supply of inverters 613 and 615.

The outputs of inverters 606 and 607 may also couple to the upper power supply of inverters 612, 613, 614 and 615, which may correspond to the sources of PMOS transistors 522 to 528 in FIG. 5.

As shown in FIG. 6B, Q mixer 604 includes inverters 616 and 618 and NMOS transistors 656, 658, 666 and 668 that are coupled in the same manner as inverters 516 and 518 and NMOS transistors 556, 558, 566 and 568, respectively, for Q mixer 504 in FIG. 5. Q mixer 604 further includes inverters 617 and 619 and NMOS transistors 657, 659, 667 and 669 that are coupled in similar manner as inverters 616 and 618 and NMOS transistors 656, 658, 666 and 668, respectively. The gates of NMOS transistors 657, 669, 656 and 668 receive the $QBB_{TXp}$ signal, and the gates of NMOS transistors 667, 659, 666 and 658 receive the $QBB_{TXn}$ signal. The drains of NMOS transistors 657, 659, 656 and 658 couple to node Xp, and the drains of NMOS transistors 667, 669, 666 and 668 couple to node Xn.

Q mixer 604 further includes inverters 608 and 609. Inverter 608 has its input receiving the $VCO_{TXp}$ signal and its output coupled to the lower power supply of inverters 617 and 619. Inverter 609 has its input receiving the $VCO_{TXn}$ signal and its output coupled to the lower power supply of inverters 616 and 618. Inverters 608 and 609 may also be omitted. In this case, the output inverter 606 in FIG. 6A may be coupled to the lower power supply of inverters 617 and 619, and the output inverter 607 may be coupled to the lower power supply of inverters 616 and 618.

Inverters 606 to 609 include VCO transistors that perform LO masking to reduce noise. Inverters 612 to 619 include LO transistors that perform transconductance switching to achieve the mixing function for upconversion. NMOS transistors 652 to 669 are baseband transistors that provide amplification for the I and Q baseband signals. NMOS transistors 672 and 674 are output transistors that are coupled in the same manner as NMOS transistors 572 and 574, respectively, in FIG. 5 and provide signal drive for the upconverted signal.

I mixer 602 includes differential pairs 642 and 644 and inverters 612 and 614, which are included in I mixer 502 in FIG. 5. I mixer 602 further includes differential pairs 643 and 645 and inverters 613 and 615 that support LO masking. Similarly, Q mixer 604 includes differential pairs 646 and 648 and inverters 616 and 618, which are included in Q mixer 504 in FIG. 5. Q mixer 604 further includes differential pairs 647 and 649 and inverters 617 and 619 that support LO masking.

FIGS. 6A and 6B show a specific design with the baseband transistors, LO transistors, and VCO transistors coupled in a specific manner and with specific signals applied to these transistors. The desired upconverted signal may also be obtained with other arrangements of the baseband transistors, LO transistors, and VCO transistors and/or by applying the signals to these transistors in other manners.

The timing diagram in FIG. 3 may be used for both I mixer 602 in FIG. 6A and Q mixer 604 in FIG. 6B. The rising edge of the $ILO_{TXp}$ signal may occur prior to the rising edge of the $VCO_{TXp}$ signal. Similarly, the rising edge of the $QLO_{TXp}$ signal may occur prior to the rising edge of $VCO_{TXn}$ signal.

I mixer 602 in FIG. 6A operates as follows. For the first phase $\phi_1$, the rising transition on the $VCO_{TXp}$ signal enables inverters 612 and 614. Since the $ILO_{TXp}$ signal is high and the $ILO_{TXn}$ signal is low, differential pair 642 is enabled, and differential pair 644 is disabled. NMOS transistors 652 and 662 drive the upconverter output based on the I baseband signal. For the second phase $\phi_2$, the rising transition on the $VCO_{TXn}$ signal enables inverters 613 and 615. Since the $QLO_{TXp}$ signal is high and the $QLO_{TXn}$ signal is low, differential pair 643 is enabled, and differential pair 645 is disabled.

NMOS transistors 653 and 663 drive the upconverter output based on the I baseband signal. For the third phase $\phi_3$, the rising transition on the $VCO_{TXp}$ signal enables inverters 612 and 614. Since the $ILO_{TXp}$ signal is low and the $ILO_{TXn}$ signal is high, differential pair 642 is disabled, and differential pair 644 is enabled. NMOS transistors 654 and 664 drive the upconverter output based on the complementary I baseband signal. For the fourth phase $\phi_4$, the rising transition on the $VCO_{TXn}$ signal enables inverters 613 and 615. Since the $QLO_{TXp}$ signal is low and the $QLO_{TXn}$ signal is high, differential pair 643 is disabled, and differential pair 645 is enabled. NMOS transistors 655 and 665 drive the upconverter output based on the complementary I baseband signal. Differential pairs 642 and 643 are driven by the I baseband signal and are enabled for one complete VCO cycle (or one half LO cycle). Differential pairs 644 and 645 are driven by the complementary I baseband signal and are enabled for the next complete VCO cycle (or the next half LO cycle).

Q mixer 604 in FIG. 6B operates in similar manner as I mixer 602 in FIG. 6A.

For upconverter 600 with LO masking, the transitions on the VCO signal are active transitions and determine the jitter in the upconverted signal. The I and Q LO signals may be generated with a frequency divider and/or a signal splitter and may have a relatively large amount of noise. The I and Q LO signals are effectively re-clocked with the VCO signal. Different differential pairs of interest are activated on different transitions of the VCO signal. These VCO transitions determine the time at which the differential pairs are activated (and hence the polarity is switched).

Upconverter 600 with switched transconductance and LO masking may have all of the advantages described above for upconverter 500 in FIG. 5. Upconverter 600 may also have other advantages due to the LO masking. In particular, the active transitions in upconverter 600 may be controlled by the VCO signal. Masking the LO signals with the VCO signal may remove the noise from the divider and/or splitter used to generate the LO signals.

A low-noise transmitter may be implemented with upconverter 600 having improved noise performance due to (i) suppression of noise from the divider and splitter used to generate the I and Q TX LO signals and (ii) reduction of noise contribution from the baseband transistors in the mixers. The improved noise performance achieved with upconverter 600 may allow for removal of a SAW filter after the upconverter (e.g., filter 142 in FIG. 1).

FIG. 5 shows an example design of upconverter 500 with switched transconductance. FIG. 6 shows an example design of upconverter 600 with switched transconductance and LO masking. An upconverter with switched transconductance and/or LO masking may also be implemented with other designs, e.g., different arrangements of the baseband transistors, LO transistors, and VCO transistors.

In general, an upconverter may include first, second, and third sets of transistors. The first set of transistors may receive baseband signals and provide an upconverted signal. The second set of transistors may couple to the sources of the transistors in the first set and may switch the transconductance of the transistors in the first set based on TX LO signals. The third set of transistors may couple to the second set of transistors and may enable and disable the transistors in the second set based on a TX VCO signal. The transistors in the second and third sets may operate as switches.

In one design, the first set of transistors includes four differential pairs. A first differential pair (e.g., differential pair 542 or 642) receives non-inverted and inverted I baseband signals. A second differential pair (e.g., differential pair 544 or 644) receives the inverted and non-inverted I baseband signals. A third differential pair (e.g., differential pair 546 or 646) receives non-inverted and inverted Q baseband signals. A fourth differential pair (e.g., differential pair 548 or 648) receives the inverted and non-inverted Q baseband signals. In one design, the second set of transistors includes four pairs of transistors coupled as four inverters. A first inverter (e.g., inverter 512 or 612) enables and disables the first differential pair based on a non-inverted I LO signal. A second inverter (e.g., inverter 514 or 614) enables and disables the second differential pair based on an inverted I LO signal. A third inverter (e.g., inverter 516 or 616) enables and disables the third differential pair based on a non-inverted Q LO signal. A fourth inverter (e.g., inverter 518 or 618) enables and disables the fourth differential pair based on an inverted Q LO signal. In one design, the third set of transistors includes two pairs of transistors coupled as two inverters. One inverter (e.g., inverter 606) enables and disables the first and second inverters based on a non-inverted VCO signal. The other inverter (e.g., inverter 609) enables and disables the third and fourth inverters based on an inverted VCO signal. The first, second, and third sets may include different and/or additional transistors.

Figure 7:
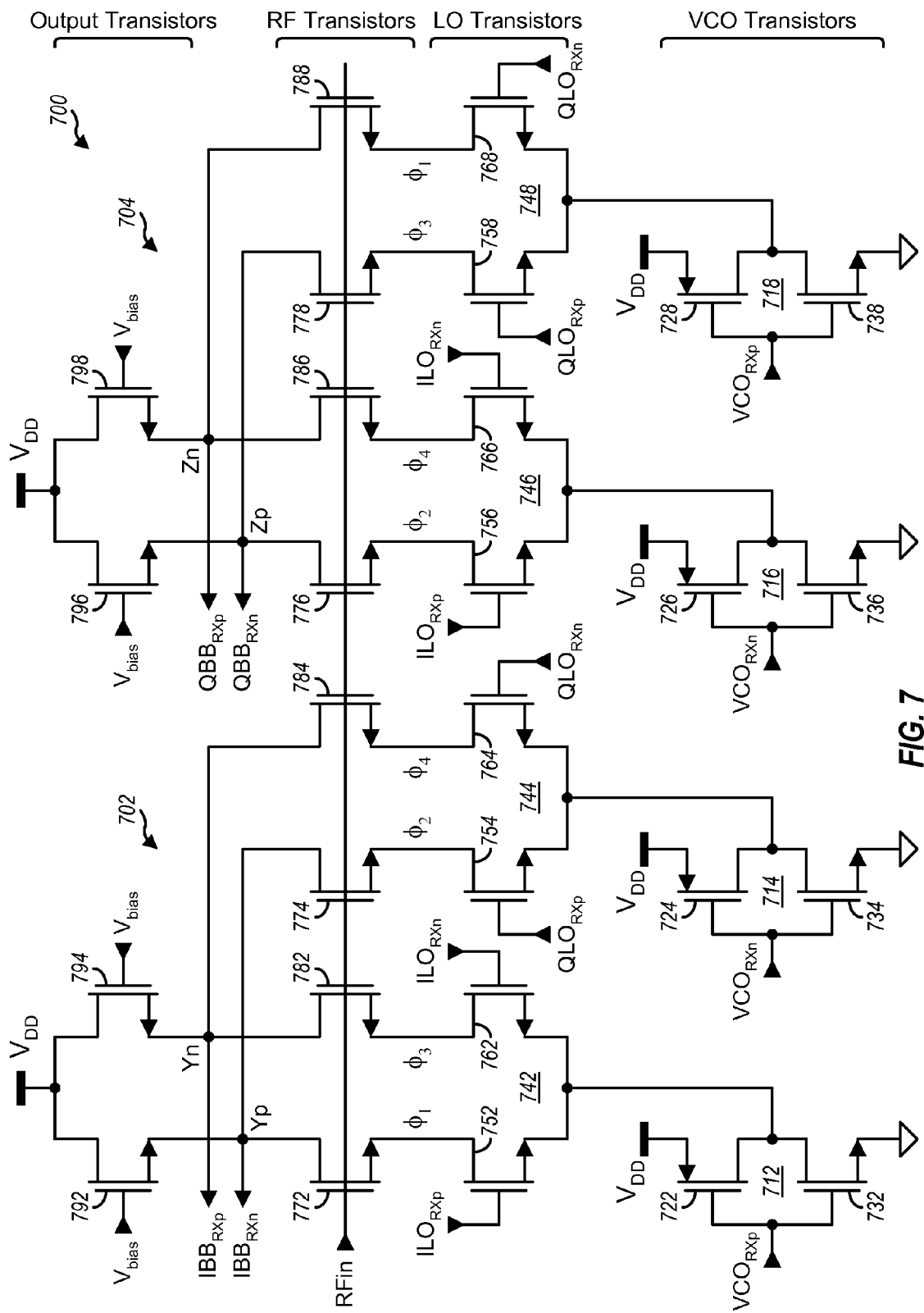
FIG. 7 shows a downconverter with switched transconductance and LO masking.

FIG. 7 shows a schematic diagram of a design of a downconverter 700 with switched transconductance and LO masking. Downconverter 700 may be used for downconverter 160 in FIG. 1 and includes an I mixer 702 and a Q mixer 704.

Within I mixer 702, an inverter 712 is implemented with a PMOS transistor 722 and an NMOS transistor 732 and receives a $VCO_{RXp}$ signal. NMOS transistors 752 and 762 form a differential pair 742 and have their sources coupled to the output of inverter 712 and their gates receiving $ILO_{RXp}$ and $ILO_{RXn}$ signals, respectively. NMOS transistors 772 and 782 have their sources coupled to the drains of NMOS transistors 752 and 762, respectively, their gates receiving the RF input signal, RFin, and their drains coupled to nodes Yp and Yn, respectively. NMOS transistors 792 and 794 have their sources coupled to nodes Yp and Yn, respectively, their gates receiving a bias voltage, $V_{bias}$, and their drains coupled to the upper power supply. An inverter 714 is implemented with a PMOS transistor 724 and an NMOS transistor 734 and receives a $VCO_{RXn}$ signal. NMOS transistors 754 and 764 form a differential pair 744 and have their sources coupled to the output of inverter 714 and their gates receiving $QLO_{RXp}$ and $QLO_{RXn}$ signals, respectively. NMOS transistors 774 and 784 have their sources coupled to the drains of NMOS transistors 754 and 764, respectively, their gates receiving the RF input signal, and their drains coupled to nodes Yp and Yn, respectively.

Within Q mixer 704, an inverter 716 is implemented with a PMOS transistor 726 and an NMOS transistor 736 and receives the $VCO_{RXn}$ signal. NMOS transistors 756 and 766 form a differential pair 746 and have their sources coupled to the output of inverter 716 and their gates receiving the $ILO_{RXp}$ and $ILO_{RXn}$ signals, respectively. NMOS transistors 776 and 786 have their sources coupled to the drains of NMOS transistors 756 and 766, respectively, their gates receiving the RFin signal, and their drains coupled to nodes Zp and Zn, respectively. NMOS transistors 796 and 798 have their sources coupled to nodes Zp and Zn, respectively, their gates receiving the $V_{bias}$ voltage, and their drains coupled to the upper power supply. An inverter 718 is implemented with a PMOS transistor 728 and an NMOS transistor 738 and receives the $VCO_{RXp}$ signal. NMOS transistors 758 and 768 form a differential pair 748 and have their sources coupled to the output of inverter 718 and their gates receiving the $QLO_{RXp}$ and $QLO_{RXn}$ signals, respectively. NMOS transistors 778 and 788 have their sources coupled to the drains of NMOS transistors 758 and 768, respectively, their gates receiving the RF input signal, and their drains coupled to nodes Zp and Zn, respectively.

MOS transistors 722 to 738 are VCO transistors that perform LO masking to reduce noise. NMOS transistors 752 to 768 are LO transistors that perform transconductance switching to achieve the mixing function for downconversion. NMOS transistors 772 to 788 are RF transistors that provide amplification for the RF input signal. NMOS transistors 792 to 798 are output transistors that provide signal drive for the downconverted signal.

FIG. 7 shows a specific design with the RF transistors, LO transistors, and VCO transistors coupled in a specific manner and with specific signals applied to these transistors. The desired baseband signals may also be obtained with other arrangements of the RF transistors, LO transistors, and VCO transistors and/or by applying the signals to these transistors in other manners.

The timing diagram in FIG. 3 may be used for downconverter 700, albeit with the $VCO_{TXp}$, $VCO_{TXn}$, $ILO_{TXp}$, $ILO_{TXn}$, $QLO_{TXp}$ and $QLO_{TXn}$ signals representing the $VCO_{RXp}$, $VCO_{RXn}$, $ILO_{RXp}$, $ILO_{RXn}$, $QLO_{RXp}$ and $QLO_{RXn}$ signals for receiver 150.

Downconverter 700 operates as follows. For the first phase $\phi_1$, the rising transition on the $VCO_{RXp}$ signal enables inverters 712 and 718. Since the $ILO_{RXp}$ and $QLO_{RXn}$ signals are high and the $ILO_{RXn}$ and $QLO_{RXp}$ signals are low, NMOS transistors 752 and 768 are enabled and drive nodes Yp and Zn, respectively, and NMOS transistors 762 and 758 are disabled. For the second phase $\phi_2$, the rising transition on the $VCO_{RXn}$ signal enables inverters 714 and 716. Since the $ILO_{RXp}$ and $QLO_{RXp}$ signals are high and the $ILO_{RXn}$ and $QLO_{RXn}$ signals are low, NMOS transistors 754 and 756 are enabled and drive nodes Yp and Zp, respectively, and NMOS transistors 764 and 766 are disabled. For the third phase $\phi_3$, the rising transition on the $VCO_{RXp}$ signal enables inverters 712 and 718. Since the $ILO_{RXn}$ and $QLO_{RXp}$ signals are high and the $ILO_{RXp}$ and $QLO_{RXn}$ signals are low, NMOS transistors 762 and 758 are enabled and drive nodes Yn and Zp, respectively, and NMOS transistors 752 and 768 are disabled. For the fourth phase $\phi_4$, the rising transition on the $VCO_{RXn}$ signal enables inverters 714 and 716. Since the $ILO_{RXn}$ and $QLO_{RXn}$ signals are high and the $ILO_{RXp}$ and $QLO_{RXp}$ signals are low, NMOS transistors 764 and 766 are enabled and drive nodes Yn and Zn, respectively, and NMOS transistors 754 and 756 are disabled.

A low-noise receiver may be implemented with downconverter 700 having improved noise performance due to (i) suppression of noise from the divider and splitter used to generate the I and Q RX LO signals and (ii) reduction of noise contribution from the RF transistors in the mixers.

FIG. 7 shows an example design of downconverter 700 with switched transconductance and LO masking. A downconverter with switched transconductance and/or LO masking may also be implemented with other designs, e.g., other arrangements of the RF transistors, LO transistors, and VCO transistors.

In general, a downconverter may include first, second, and third sets of transistors. The first set of transistors may receive a modulated signal and provide baseband signals. The second set of transistors may couple to the sources of the transistors in the first set and may switch the transconductance of the transistors in the first set based on RX LO signals. The third set of transistors may couple to the second set of transistors and may enable and disable the transistors in the second set based on an RX VCO signal.

In one design, the second set of transistors includes four differential pairs. A first differential pair (e.g., differential pair 742) receives non-inverted and inverted I LO signals. A second differential pair (e.g., differential pair 744) receives non-inverted and inverted Q LO signals. A third differential pair (e.g., differential pair 746) receives the non-inverted and inverted I LO signals. A fourth differential pair (e.g., differential pair 748) receives the non-inverted and inverted Q LO signals. In one design, the first set of transistors includes four pairs of transistors (e.g., transistors 772 to 788) that have their sources coupled to the drains of the four differential pairs. In one design, the third set of transistors includes four pairs of transistors coupled as four inverters (e.g., inverters 712 to 718). These four inverters enable and disable the four differential pairs based on non-inverted and inverted VCO signals. The first, second, and third sets may include different and/or additional transistors.

Figure 8:
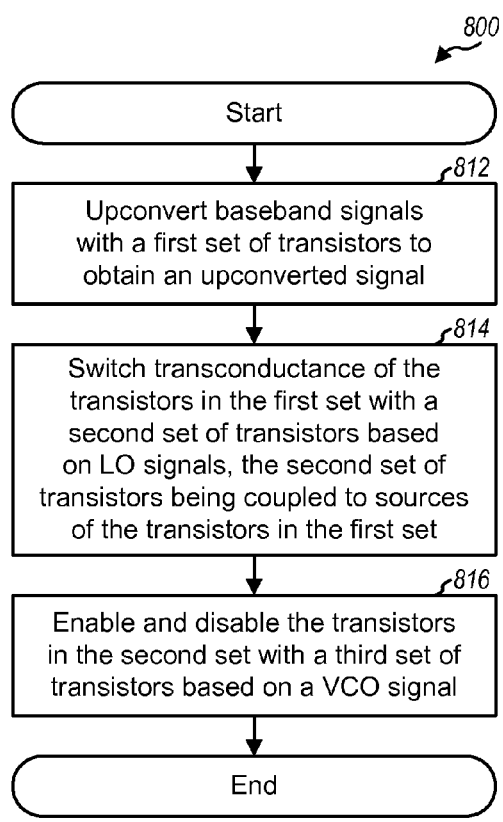
FIG. 8 shows a process for performing upconversion.

FIG. 8 shows a design of a process 800 for performing upconversion. Baseband signals may be upconverted with a first set of transistors to obtain an upconverted signal (block 812). The first set of transistors may comprise the baseband transistors in FIG. 5 or in FIGS. 6A and 6B. The modulated signal may be upconverted directly from baseband to RF (for a direct-downconversion architecture) or from baseband or IF (for a super-heterodyne architecture).

The transconductance of the transistors in the first set may be switched with a second set of transistors based on LO signals, with the second set of transistors being coupled to the sources of the transistors in the first set (block 814). The second set of transistors may comprise the LO transistors in FIG. 5 or in FIGS. 6A and 6B. The transistors in the second set may be enabled and disabled with a third set of transistors based on a VCO signal (block 816). The third set of transistors may comprise the VCO transistors within inverters 606 to 609 in FIGS. 6A and 6B. The transistors in the second and third sets may operate as switches. The LO signals may be re-clocked with the VCO signal, and the transconductance of the transistors in the first set may be switched during transitions of the VCO signal.

Figure 9:
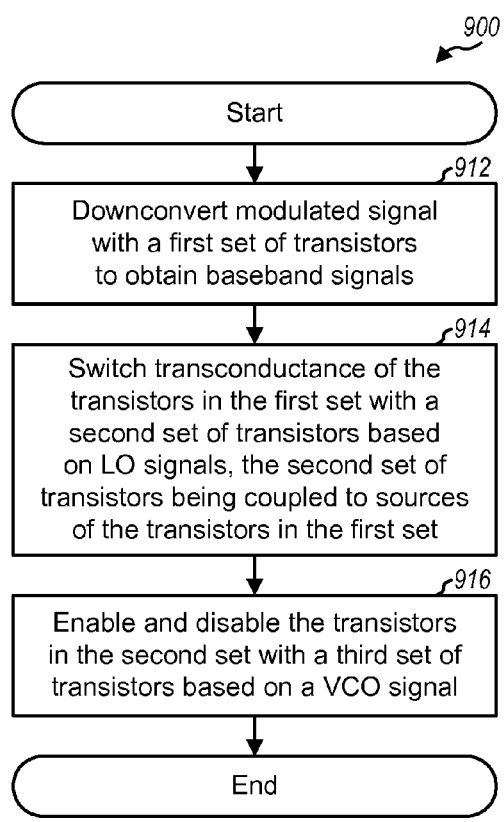
FIG. 9 shows a process for performing downconversion.

FIG. 9 shows a design of a process 900 for performing downconversion. A modulated signal may be downconverted with a first set of transistors to obtain baseband signals (block 912). The first set of transistors may comprise the RF transistors in FIG. 7. The modulated signal may be downconverted directly from RF to baseband (for a direct-downconversion architecture) or from IF to baseband (for a super-heterodyne architecture).

The transconductance of the transistors in the first set may be switched with a second set of transistors based on LO signals, with the second set of transistors being coupled to the sources of the transistors in the first set (block 914). The second set of transistors may comprise the LO transistors in FIG. 7. The transistors in the second set may be enabled and disabled with a third set of transistors based on a VCO signal (block 916). The third set of transistors may comprise the VCO transistors in FIG. 7. The LO signals may be re-clocked with the VCO signal, and the transconductance of the transistors in the first set may be switched during transitions of the VCO signal.

The upconverter and downconverter described herein may each be implemented on an IC, an analog IC, an RFIC, a mixed-signal IC, an application specific integrated circuit (ASIC), a printed circuit board (PCB), an electronics device, etc. The upconverter and downconverter may each be fabricated with various IC process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), etc.

An apparatus implementing the upconverter and/or downconverter described herein may be a stand-alone device or may be part of a larger device. A device may be (i) a standalone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
a first set of transistors operative to receive baseband signals and provide an upconverted signal, wherein the first set of transistors comprises a plurality of differential pairs operative to receive a differential inphase (I) baseband signal and a plurality of differential pairs operative to receive a differential quadrature (Q) baseband signal; and
a second set of transistors coupled to sources of the transistors in the first set and operative to switch transconductance of the transistors in the first set based on local oscillator (LO) signals.

2. The apparatus of claim 1, wherein the first set of transistors comprises a first differential pair operative to receive non-inverted and inverted inphase (I) baseband signals, a second differential pair operative to receive the inverted and non-inverted I baseband signals, a third differential pair operative to receive non-inverted and inverted quadrature (Q) baseband signals, and a fourth differential pair operative to receive the inverted and non-inverted Q baseband signals.

3. The apparatus of claim 2, wherein the second set of transistors comprises a first pair of transistors coupled as a first inverter and to sources of the first differential pair and operative to receive a non-inverted I LO signal, a second pair of transistors coupled as a second inverter and to sources of the second differential pair and operative to receive an inverted I LO signal, a third pair of transistors coupled as a third inverter and to sources of the third differential pair and operative to receive a non-inverted Q LO signal, and a fourth pair of transistors coupled as a fourth inverter and to sources of the fourth differential pair and operative to receive an inverted Q LO signal.

4. The apparatus of claim 1, further comprising:
a third set of transistors coupled to the second set of transistors and operative to enable and disable the transistors in the second set based on a voltage-controlled oscillator (VCO) signal.

5. The apparatus of claim 4, wherein the third set of transistors re-clocks the LO signals with the VCO signal, and wherein the transconductance of the transistors in the first set is switched during transitions of the VCO signal.

6. The apparatus of claim 4, wherein the first set of transistors comprises first, second, third and fourth differential pairs operative to receive the differential I baseband signal, and fifth, sixth, seven, and eight differential pairs operative to receive the differential quadrature (Q) baseband signal.

7. The apparatus of claim 6, wherein the second set of transistors comprises
first, second, third and fourth pairs of transistors coupled as first, second, third and fourth inverters, respectively, and operative to receive I and Q LO signals, and
fifth, sixth, seventh, and eighth pairs of transistors coupled as fifth, sixth, seventh, and eighth inverters, respectively, and operative to receive the I and Q LO signals, the first through eighth inverters being coupled to sources of the first through eighth differential pairs, respectively.

8. The apparatus of claim 7, wherein the third set of transistors comprises:
a ninth pair of transistors coupled as a ninth inverter and operative to receive a non-inverted voltage-controlled oscillator signal and to enable and disable the first and second pairs of transistors; and
a tenth pair of transistors coupled as a tenth inverter and operative to receive an inverted VCO signal and to enable and disable the third and fourth pairs of transistors.

9. The apparatus of claim 1, further comprising:
a pair of transistors coupled to drains of the transistors in the first set and operative to provide signal drive for the upconverted signal.

10. The apparatus of claim 1, wherein the transistors in the second set operate as switches.

11. The apparatus of claim 1, wherein the first and second sets of transistors comprise metal oxide semiconductor transistors.

12. The apparatus of claim 1, wherein the first and second sets of transistors upconvert the baseband signals directly from baseband to radio frequency.

13. An integrated circuit comprising:
a first set of transistors operative to receive baseband signals and provide an upconverted signal, wherein the first set of transistors comprises a plurality of differential pairs operative to receive a differential inphase (I) baseband signal and a plurality of differential pairs operative to receive a differential quadrature (Q) baseband signal; and a second set of transistors coupled to sources of the transistors in the first set and operative to switch transconductance of the transistors in the first set based on local oscillator (LO) signals.

14. The integrated circuit of claim 13, wherein the first set of transistors comprises a first differential pair operative to receive non-inverted and inverted inphase (I) baseband signals, a second differential pair operative to receive the inverted and non-inverted I baseband signals, a third differential pair operative to receive non-inverted and inverted quadrature (Q) baseband signals, and a fourth differential pair operative to receive the inverted and non-inverted Q baseband signals.

15. The integrated circuit of claim 14, wherein the second set of transistors comprises a first pair of transistors coupled as a first inverter and to sources of the first differential pair and operative to receive a non-inverted I LO signal, a second pair of transistors coupled as a second inverter and to sources of the second differential pair and operative to receive an inverted I LO signal, a third pair of transistors coupled as a third inverter and to sources of the third differential pair and operative to receive a non-inverted Q LO signal, and a fourth pair of transistors coupled as a fourth inverter and to sources of the fourth differential pair and operative to receive an inverted Q LO signal.

16. The integrated circuit of claim 15, further comprising:
a third set of transistors coupled to the second set of transistors and operative to enable and disable the transistors in the second set based on a voltage-controlled oscillator (VCO) signal.

17. A method comprising:
upconverting baseband signals with a first set of transistors to obtain an upconverted signal, the first set of transistors comprising a plurality of differential pairs operative to receive a differential inphase (I) baseband signal and a plurality of differential pairs operative to receive a differential quadrature (Q) baseband signal; and
switching transconductance of the transistors in the first set with a second set of transistors based on local oscillator (LO) signals, the second set of transistors being coupled to sources of the transistors in the first set.

18. The method of claim 17, further comprising:
enabling and disabling the transistors in the second set with a third set of transistors based on a voltage-controlled oscillator (VCO) signal.

19. The method of claim 18, further comprising:
re-clocking the LO signals with the VCO signal, and wherein the transconductance of the transistors in the first set is switched during transitions of the VCO signal.

20. The method of claim 17, wherein the upconverting the baseband signals comprises upconverting the baseband signals directly from baseband to radio frequency with the first set of transistors.

21. An apparatus comprising:
a first set of transistors operative to receive a modulated signal and provide baseband signals;
a second set of transistors coupled to sources of the transistors in the first set and operative to switch transconductance of the transistors in the first set based on local oscillator (LO) signals, wherein the second set of transistors comprises a plurality of differential pairs operative to receive a differential inphase (I) local oscillator signal and a plurality of differential pairs operative to receive a differential quadrature (Q) local oscillator signal; and
a third set of transistors coupled to the second set of transistors and operative to enable and disable the transistors in the second set based on a voltage-controlled oscillator (VCO) signal.

22. The apparatus of claim 21, wherein the second set of transistors comprises a first differential pair operative to receive non-inverted and inverted inphase (I) LO signals, a second differential pair operative to receive non-inverted and inverted quadrature (Q) LO signals, a third differential pair operative to receive the non-inverted and inverted I LO signals, and a fourth differential pair operative to receive the non-inverted and inverted Q LO signals.

23. The apparatus of claim 22, wherein the first set of transistors comprises a first pair of transistors having sources coupled to drains of the first differential pair, a second pair of transistors having sources coupled to drains of the second differential pair, a third pair of transistors having sources coupled to drains of the third differential pair, and a fourth pair of transistors having sources coupled to drains of the fourth differential pair.

24. The apparatus of claim 22, wherein the third set of transistors comprises a first pair of transistors coupled as a first inverter and operative to enable and disable the first differential pair based on a non-inverted VCO signal, a second pair of transistors coupled as a second inverter and operative to enable and disable the second differential pair based on an inverted VCO signal, a third pair of transistors coupled as a third inverter and operative to enable and disable the third differential pair based on the inverted VCO signal, and a fourth pair of transistors coupled as a fourth inverter and operative to enable and disable the fourth differential pair based on the non-inverted VCO signal.

25. The apparatus of claim 21, wherein the third set of transistors re-clocks the LO signals with the VCO signal, and wherein the transconductance of the transistors in the first set is switched during transitions of the VCO signal.

26. The apparatus of claim 21, wherein the transistors in the second and third sets operate as switches.

27. The apparatus of claim 21, wherein the first, second and third sets of transistors comprise metal oxide semiconductor transistors.

28. The apparatus of claim 21, wherein the first, second and third sets of transistors downconvert the modulated signal directly from radio frequency to baseband.

29. An integrated circuit comprising:
a first set of transistors operative to receive a modulated signal and provide baseband signals;
a second set of transistors coupled to sources of the transistors in the first set and operative to switch transconductance of the transistors in the first set based on local oscillator (LO) signals, wherein the second set of transistors comprises a plurality of differential pairs operative to receive a differential inphase (I) local oscillator signal and a plurality of differential pairs operative to receive a differential quadrature (Q) local oscillator signal; and
a third set of transistors coupled to the second set of transistors and operative to enable and disable the transistors in the second set based on a voltage-controlled oscillator (VCO) signal.

30. The integrated circuit of claim 29, wherein the second set of transistors comprises a first differential pair operative to receive non-inverted and inverted inphase (I) LO signals, a second differential pair operative to receive non-inverted and inverted quadrature (Q) LO signals, a third differential pair operative to receive the non-inverted and inverted I LO signals, and a fourth differential pair operative to receive the non-inverted and inverted Q LO signals.

31. The integrated circuit of claim 30, wherein the first set of transistors comprises a first pair of transistors having sources coupled to drains of the first differential pair, a second pair of transistors having sources coupled to drains of the second differential pair, a third pair of transistors having sources coupled to drains of the third differential pair, and a fourth pair of transistors having sources coupled to drains of the fourth differential pair.

32. The integrated circuit of claim 30, wherein the third set of transistors comprises a first pair of transistors coupled as a first inverter and operative to enable and disable the first differential pair based on a non-inverted VCO signal, a second pair of transistors coupled as a second inverter and operative to enable and disable the second differential pair based on an inverted VCO signal, a third pair of transistors coupled as a third inverter and operative to enable and disable the third differential pair based on the inverted VCO signal, and a fourth pair of transistors coupled as a fourth inverter and operative to enable and disable the fourth differential pair based on the non-inverted VCO signal.

33. A method comprising:
downconverting a modulated signal at a first set of transistors to obtain baseband signals;
switching transconductance of the transistors in the first set with a second set of transistors based on local oscillator (LO) signals, the second set of transistors being coupled to sources of the transistors in the first set and comprising a plurality of differential pairs operative to receive a differential inphase (I) local oscillator signal and a plurality of differential pairs operative to receive a differential quadrature (Q) local oscillator signal; and
enabling and disabling the transistors in the second set with a third set of transistors based on a voltage-controlled oscillator (VCO) signal.

34. The method of claim 33, further comprising:
re-clocking the LO signals with the VCO signal, and wherein the transconductance of the transistors in the first set is switched during transitions of the VCO signal.

35. The method of claim 33, wherein the downconverting the modulated signal comprises downconverting the modulated signal directly from radio frequency to baseband with the first set of transistors.

36. An apparatus comprising:
means for upconverting baseband signals with a first set of transistors to obtain an upconverted signal, the first set of transistors comprising a plurality of differential pairs operative to receive a differential inphase (I) baseband signal and a plurality of differential pairs operative to receive a differential quadrature (Q) baseband signal; and
means for switching transconductance of the transistors in the first set with a second set of transistors based on local oscillator (LO) signals, the second set of transistors being coupled to sources of the transistors in the first set.

37. An apparatus comprising:
means for downconverting a modulated signal at a first set of transistors to obtain baseband signals;
means for switching transconductance of the transistors in the first set with a second set of transistors based on local oscillator (LO) signals, the second set of transistors being coupled to sources of the transistors in the first set and comprising a plurality of differential pairs operative to receive a differential inphase (I) local oscillator signal and a plurality of differential pairs operative to receive a differential quadrature (Q) local oscillator signal; and
means for enabling and disabling the transistors in the second set with a third set of transistors based on a voltage-controlled oscillator (VCO) signal.

* * * * *